US009471114B2

(12) United States Patent
Gilbert et al.

(10) Patent No.: US 9,471,114 B2
(45) Date of Patent: Oct. 18, 2016

(54) COOLING OF A VOLATILE MEMORY DEVICE TO PRESERVE DATA DURING POWER LOSS

(71) Applicant: International Business Machines Corporation, Armonk, NY (US)

(72) Inventors: David A. Gilbert, Manchester (GB); Patrick Varley, Manchester (GB)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 14/107,494

(22) Filed: Dec. 16, 2013

(65) Prior Publication Data

US 2014/0168888 A1 Jun. 19, 2014

(30) Foreign Application Priority Data

Dec. 17, 2012 (GB) .................................. 1222696.5

(51) Int. Cl.
*G06F 1/20* (2006.01)
*H01L 23/473* (2006.01)
*H01L 23/34* (2006.01)

(52) U.S. Cl.
CPC ............. *G06F 1/20* (2013.01); *H01L 23/473* (2013.01); *G06F 2200/201* (2013.01); *H01L 23/34* (2013.01); *H01L 2924/0002* (2013.01)

(58) Field of Classification Search
CPC ....... G06F 1/20; H01L 23/473; H01L 23/34; H01L 2924/0002; H01L 2924/00
USPC ..................................... 62/259.2; 361/679.46
See application file for complete search history.

(56) References Cited

U.S. PATENT DOCUMENTS

| 4,721,589 | A | * | 1/1988 | Harris | ................... | B29C 47/385 |
|---|---|---|---|---|---|---|
| | | | | | | 264/40.1 |
| 5,239,664 | A | * | 8/1993 | Verrier | ................. | G06K 19/073 |
| | | | | | | 713/194 |
| 6,178,928 | B1 | * | 1/2001 | Corriveau | ............... | F01P 7/048 |
| | | | | | | 123/41.12 |
| 6,707,748 | B2 | | 3/2004 | Lin et al. | | |
| 7,403,440 | B2 | * | 7/2008 | Perner | ....................... | G11C 7/04 |
| | | | | | | 365/211 |
| 7,681,410 | B1 | | 3/2010 | Bean, Jr. | | |
| 8,090,988 | B2 | | 1/2012 | Hoang | | |
| 8,266,398 | B2 | | 9/2012 | Manczak et al. | | |

(Continued)

FOREIGN PATENT DOCUMENTS

| GB | 2459543 A | 11/2009 |
|---|---|---|
| JP | 2012026620 A | 2/2012 |
| WO | 2006060237 A2 | 6/2006 |

OTHER PUBLICATIONS

IPCOM000073582D, "Method to Mitigate Data Loss in a Multiple Failure Scenario," Feb. 22, 2005.

(Continued)

*Primary Examiner* — Mohammad M Ali
(74) *Attorney, Agent, or Firm* — Roy W. Truelson

(57) ABSTRACT

A system for providing cooling of a memory device comprises a cooling system arranged to store a coolant, a valve system connected to the output of the cooling system, and a control system connected to the valve system and arranged to open the valve system when power is lost to the control system. The system further comprises a delivery system connected to the output of the valve system and arranged to deliver the coolant to the memory device and the cooling system comprises a canister of low boiling point fluid.

9 Claims, 4 Drawing Sheets

(56) References Cited

U.S. PATENT DOCUMENTS

| | | | | |
|---|---|---|---|---|
| 8,518,588 B2* | 8/2013 | Wake | ............... | H01M 8/04141 429/414 |
| 9,052,722 B2* | 6/2015 | Chainer | ............... | G05D 7/0635 |
| 2004/0027001 A1* | 2/2004 | Reed, III | ............... | B60P 3/0257 307/10.1 |
| 2004/0047788 A1* | 3/2004 | Abe | ............... | B01J 8/04 423/247 |
| 2005/0270738 A1* | 12/2005 | Hellriegel | ............... | H05K 7/20836 361/679.46 |
| 2006/0196634 A1* | 9/2006 | Sato | ............... | B60H 1/00885 165/41 |
| 2008/0114521 A1* | 5/2008 | Doering | ............... | B60W 30/16 701/96 |
| 2009/0000779 A1* | 1/2009 | Hickam | ............... | F01P 7/167 165/299 |
| 2009/0303630 A1 | 12/2009 | Zhou | | |
| 2010/0028740 A1* | 2/2010 | Kume | ............... | H01M 8/04029 429/413 |
| 2010/0073871 A1 | 3/2010 | Flynn | | |
| 2010/0246117 A1* | 9/2010 | Brunschwiler | ............... | G06F 1/20 361/679.53 |
| 2011/0282619 A1* | 11/2011 | Laursen | ............... | G01K 1/022 702/130 |

OTHER PUBLICATIONS

J. Alex Halderman et al., "Lest We Remember: Cold Boot Attacks on Encryption Keys," Published in Proc. 2008 USENIX Security Symposium; Feb. 21, 2008.

\* cited by examiner

COOLING OF A VOLATILE MEMORY DEVICE TO PRESERVE DATA DURING POWER LOSS

FIELD OF THE INVENTION

This invention relates to a system for, and a method of, providing cooling of a memory device. In an embodiment, the invention provides rapid memory cooling of a volatile memory device in the event of unexpected power loss.

BACKGROUND OF THE INVENTION

Volatile RAM is often used as write cache in storage or processing systems. Although this has technical advantages, there is the significant disadvantage that if there is a loss of power before the data reaches the storage disk, then data can be lost before it has been safely stored. Various schemes to preserve the data are available. One such scheme uses high current battery systems to dump the data to disk, hopefully before the data is lost, or to maintain the contents until normal power is restored. None of these systems is perfect. For example, high current batteries might not be suitable for use in some environments due to the risk of fire, and there is still a risk that data will be lost due to a flat battery.

BRIEF SUMMARY OF THE INVENTION

According to a first aspect of the present invention, there is provided a system for providing cooling of a memory device comprising a cooling system arranged to store a coolant, a valve system connected to the output of the cooling system, and a control system connected to the valve system and arranged to open the valve system when power is lost to the control system.

According to a second aspect of the present invention, there is provided a method for providing cooling of a memory device comprising storing a coolant in a cooling system, retaining the coolant in the cooling system with a valve system connected to the output of the cooling system, and opening the valve system when power is lost to the control system.

Owing to the invention, it is possible to provide cooling protection to a volatile memory device in the event of a power cut. This provides a method of reducing the chances of losing data that is stored by the memory device. A rapid physical cooling system is present, close to the memory device being protected, which is triggered mechanically/physically by the loss of power. Memory that is substantially cooled has been shown to retain data for an hour or more and the coolant will rapidly lower the temperature of the memory device being protected. Experiments have shown that cooling DRAM (Dynamic Random Access Memory), the most common form of volatile RAM in current usage, allows it to hold its data for considerably longer, even when no power is applied.

In a preferred embodiment, a canister of coolant, for example $CO_2$ or a low boiling point liquid which is preferably non-toxic and that does not promote fire, is attached to a memory subsystem. The canister is connected to a pair of electrically controlled valves A and B and thermally connected, via piping or physical contact, with the memory subsystem being protected. Valve A is open when there is no energy applied. Valve B is closed by default, but may be unlocked by an electrical signal, and will maintain its open/closed state after removal of energy. The system starts with valve B closed and is unarmed. When the system boots, and starts writing to the memory device, firmware energises valve A and thus prevents release of the coolant and then locks valve B in the open position and the system is now armed. On a clean closedown, the system writes data out, locks valve B in the closed position and is now unarmed again. When in the armed state, any loss of power results in valve A opening, with no control signal needed since it is the loss of power itself that opens valve A and this results in rapid cooling of the memory device. When power is restored, the contents of the RAM may be dumped for analysis; the use of ECC RAM increases the chances that the data can be recovered. In a system with battery backup, valve A's power may come from the backup battery system so that only after battery power is lost is the system triggered. The system may include mechanisms for recycling coolant and/or easy replacement of the coolant canister.

BRIEF DESCRIPTION OF THE DRAWINGS

Embodiments of the present invention will now be described, by way of example only, with reference to the following drawings, in which.

DETAILED DESCRIPTION OF THE DRAWINGS

Figure 1:
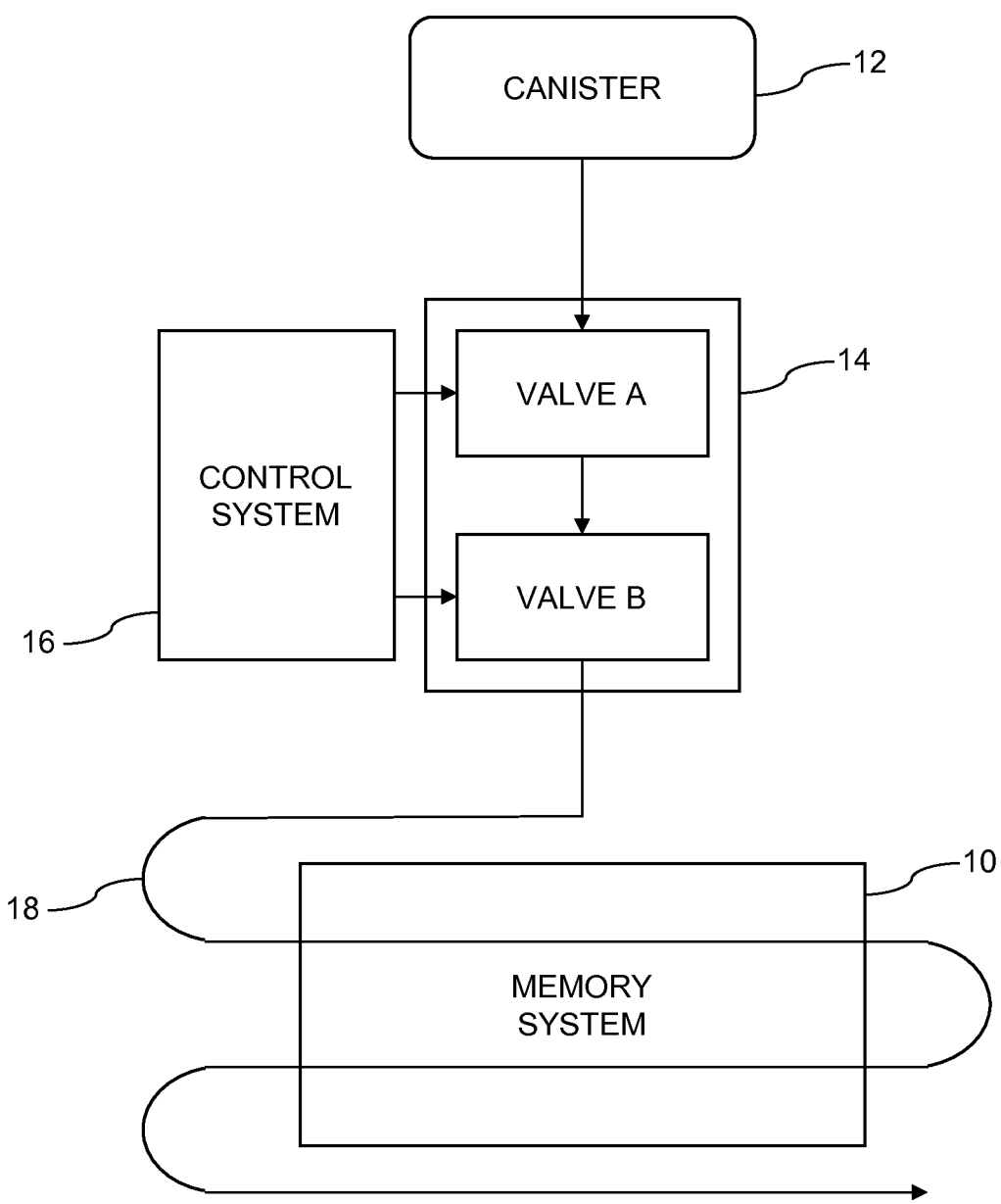
FIG. 1 is a schematic diagram of a system for providing cooling of a memory device.

FIG. 1 shows schematically a system for providing cooling of a memory device 10. The system comprises a cooling system 12, which is arranged to store a coolant, a valve system 14, which is connected to the output of the cooling system 12, and a control system 16, which is connected to the valve system 14 and is arranged to open the valve system 14 when power is lost to the control system 16. The purpose of the system shown in FIG. 1 is to provide emergency protection for the memory device 10, which in this example is a volatile memory system 10, which requires power to maintain its storage function.

The system also comprises a delivery system 18, which is connected to the output of the valve system 14 and is arranged to deliver the coolant from the cooling system 12 to the memory device 10. The delivery system 18 is optional and will depend upon the specific implementation of the overall system. In this example, the delivery system 18 takes the form of a sealed pipe that is in close proximity to the memory device 10 and snakes to and from over the memory device 10. The cooling system 12 comprises a canister of low boiling point fluid and this is exhausted at the end of the delivery system 18.

The valve system 14 comprises a pair of valves A and B that are in series. The valve system 14 comprises a valve A that requires power to remain open. The valve B requires power to switch the valve B from open to closed position and vice versa, but the removal of power from the valve B does not change its configuration in any way. The two valves A and B are connected to the control system 16 which operates these two valves. The control system 16 is connected to other (not shown) components, as is the memory system 10. Both the control system 16 and the memory system 10 are powered by external power sources (not shown).

Figure 2:
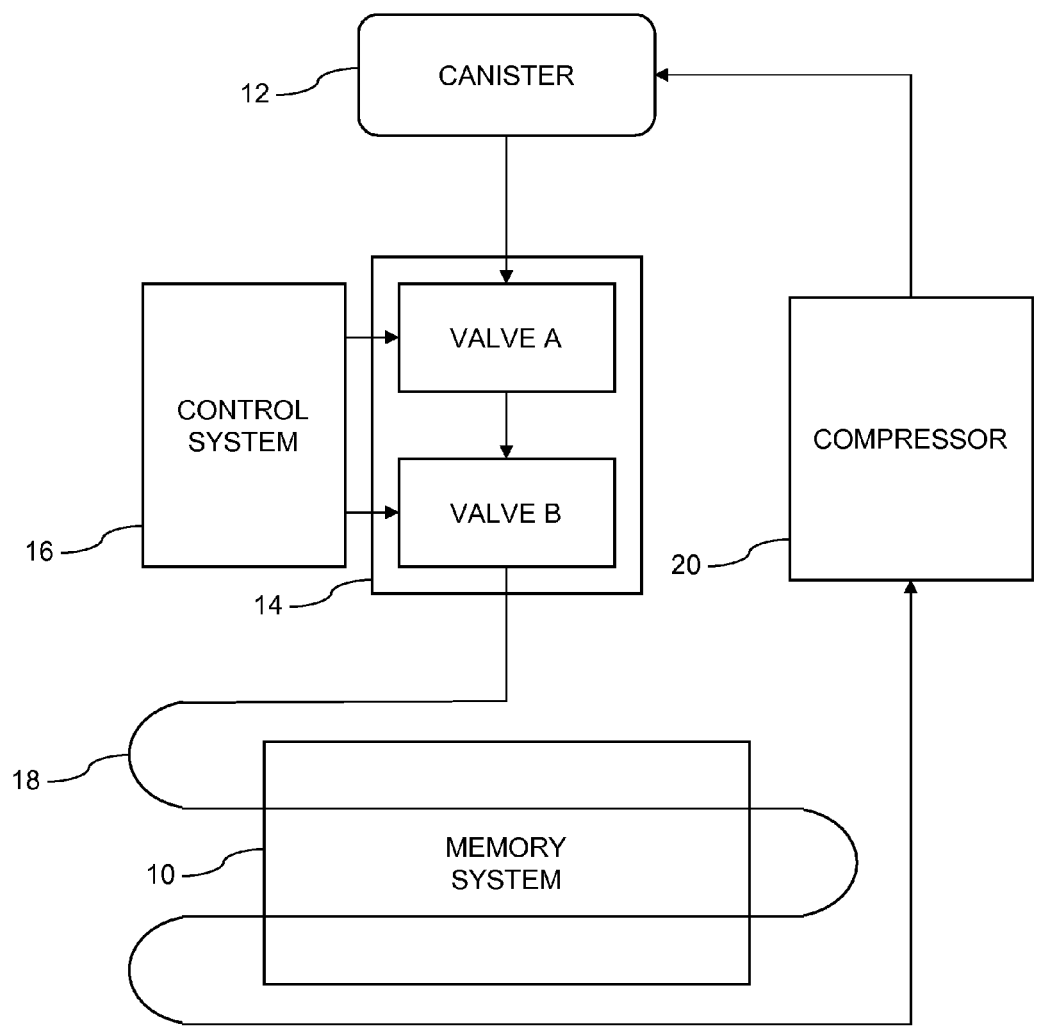
FIG. 2 is a schematic diagram of a second embodiment of a system for providing cooling of a memory device.

A second embodiment of the system for providing cooling of the memory device 10 is shown in FIG. 2. This embodiment is identical to the version shown in FIG. 1, except that the system is further provided with a compressor 20. The compressor 20 is arranged to capture the coolant after output from the cooling system 12. The compressor is connected to the end of the delivery system 18 and captures the coolant after it has been deployed in order to recycle that coolant back to the cooling system 12 for re-use in the future. This also prevents the exhausting of the coolant into the local atmosphere, which occurs in the FIG. 1 embodiment.

The control system 16 operates the valves A and B. When the system is not in operation, the valve B is in its closed position and the valve A is in its open position (since valve A requires power to keep it closed). Once the memory system 10 is being used, then the control system 16 energises valve A, closing that valve, and opens valve B (which requires power to open or close but not to remain open or closed). The system is now armed and is providing emergency protection to the memory system 10, in the event of an unexpected power cut. If the memory system 10 is no longer being used, then valve B is shut and valve A has power removed, which opens that valve.

However, if the valve system 14 is armed (valve B open and valve A closed), then should there be a power cut, then valve A will automatically open, since this valve requires power to keep it closed. At this point, the coolant being stored by the cooling system 12 is released into the delivery system 18 and will instantaneously cool the memory system 10, providing protection against the power loss to the memory system 10. Whatever data is being stored by the memory system 10 will be retained by the memory system 10, as the sudden cooling of the volatile memory will help that device retain the data that is present.

Figure 3:
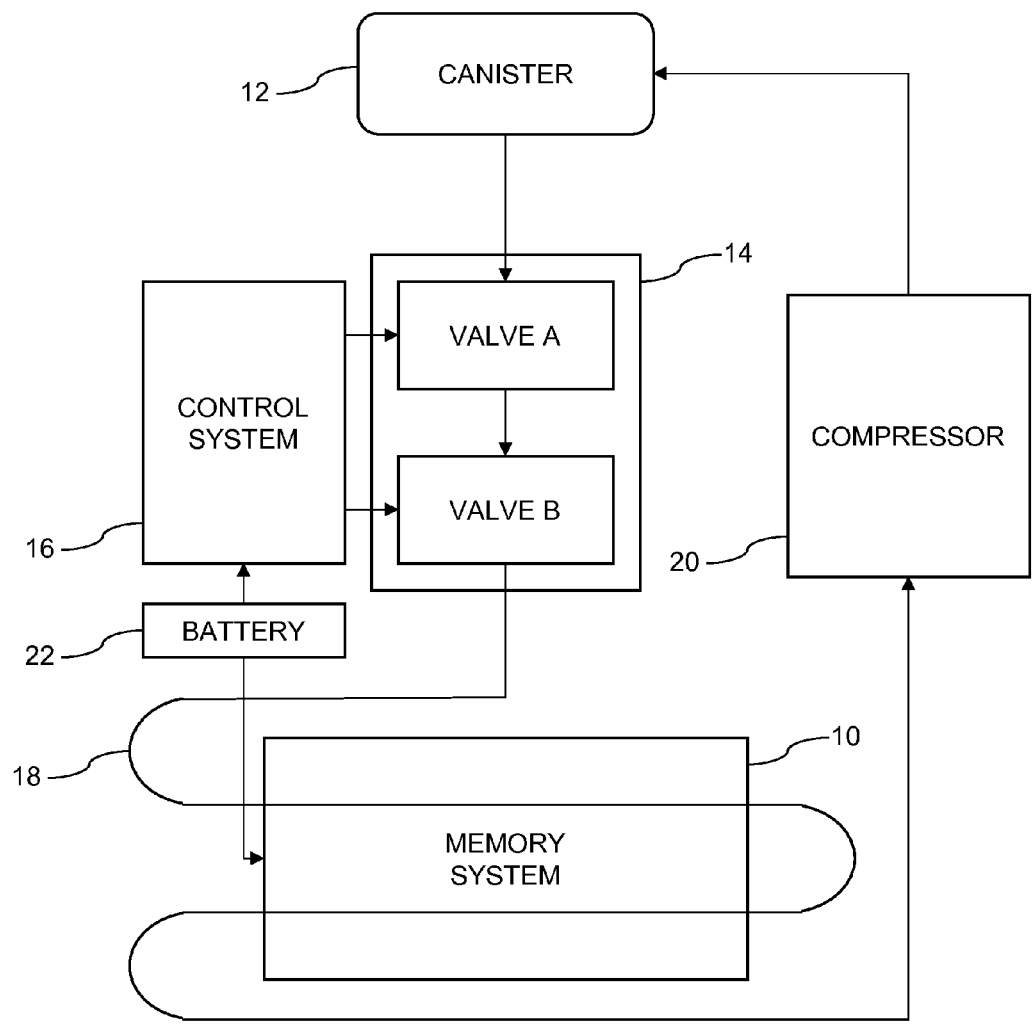
FIG. 3 is a schematic diagram of a third embodiment of a system for providing cooling of a memory device.

A third embodiment of the system for providing cooling of the memory device 10 is shown in FIG. 3. This system is identical to the embodiment shown in FIG. 2, with the addition of a battery 22. The battery 22 is connected to the memory device 10 and is arranged to provide backup electrical power to that device 10. In addition, the battery 22 is also connected to the control system 16 and is arranged to provide backup electrical power to the control system 16, which controls the valve system 14. The battery 22 can be rechargeable and can be charged from the normal power source that is powering the control system 16 and memory system 10.

The system shown in FIG. 3 operates in the same way as the two previous embodiments in that in an emergency power cut, the cooling system 12 is able to deliver coolant to the memory device 10, to protect the data being stored by that memory device 10. The valves A and B are operated by the control system 16 in exactly the same manner as described above, with valve B open until the system is armed, when valve A is energised to close and valve B is opened, rendering the system in an armed condition. Any power loss to the control system 16 will result in the valve A opening and the coolant from the cooling system 12 being delivered.

The advantage of the battery 22 is that should the power be cut to the control system 16 and the memory system 10, the battery 22 will provide power first, before the deployment of any coolant. Only if this battery fails will the control system 16 be without power and the coolant within the cooling system 12 be delivered to cool the memory system.

The battery 22 provides a first layer of protection to the memory system 10 and should allow the data within the memory system 10 to be written out to disk before it is lost. Should this battery 22 be flat or run out of sufficient power, then the control system 16 will lose power, causing the valve A to open, with the result that the coolant exits the canister 12.

Figure 4:
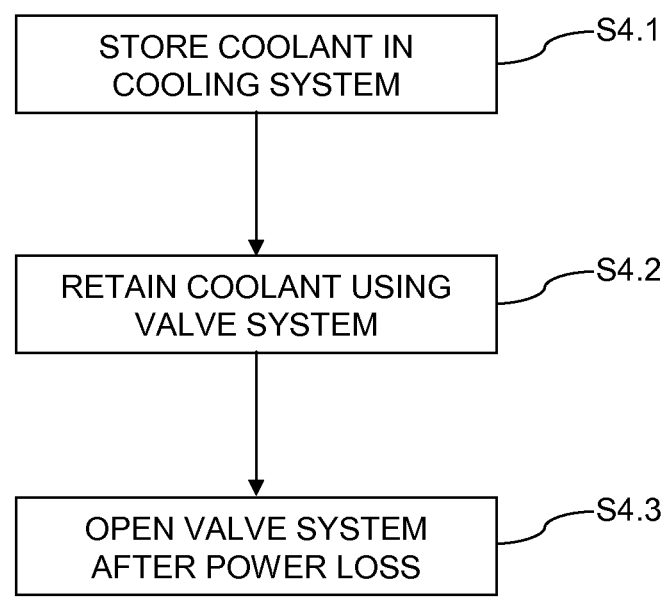
FIG. 4 is a flowchart of a method of for providing cooling of a memory device.

FIG. 4 summarises the method for providing cooling of the memory device 10. The method comprises the steps of, firstly, step S4.1, which comprises storing a coolant in the cooling system 12 and secondly, step S4.2, which comprises retaining the coolant in the cooling system 12 with a valve system 14 connected to the output of the cooling system 12. The valve system 14 retains the coolant within the cooling system 12 until it is needed and is controlled by the control system 16. In the preferred embodiment, the valve system 14 comprises a pair of valves arranged in series, one of which is always closed before the coolant is deployed.

The final step of the method comprises step S4.3, which comprises opening the valve system 14 when power is lost to the control system 16. Once the control system 16 is armed, then any power loss to the control system 16 will cause the valve system 14 to open, since the armed condition means that power is required to keep the valve system 14 closed. Once power is lost, then the valve system 14 will open and the coolant within the cooling system 12 will be deployed to cool the memory device 10. The opening of the valve system 14 happens automatically after power is lost to the control system 16.

As described above, the valve system 14 has two main conditions, armed and unarmed. In the unarmed condition, there is no power to the control system 16 and the valve system 14 is closed. The memory device 10 is assumed not to be in use. In the armed condition, the control system 16 is powered 16 and the valve system 14 is closed, but the valve system 14 (in the armed condition) will open should there be any power loss to the control system 16. This is the condition used when the memory device 10 is assumed to be in use and in need of protection from any sudden power loss.

The invention claimed is:

1. A system for preserving data stored in a memory device in the presence of a power failure, comprising:
    a volatile memory device for storing digital data used in a digital data system;
    a coolant storage container arranged to store a standby coolant, the standby coolant remaining stored in the coolant storage container while power is supplied to the volatile memory device;
    a valve system connected to the output of the coolant storage container; and
    a control system connected to the valve system and arranged to open the valve system when power is lost to the volatile memory device,
    wherein responsive to a loss of power to the volatile memory device, the control system preserves data stored in the volatile memory device by opening the valve system to release coolant from the coolant storage container to cool the volatile memory device, the coolant reducing the temperature of the volatile memory device substantially below an operating temperature thereof to preserve data stored therein.

2. The system according to claim 1, and further comprising a delivery system connected to the output of the valve system and arranged to deliver the coolant to the memory device.

3. The system according to claim 1, wherein the coolant storage container comprises a canister of low boiling point fluid.

4. The system according to claim 1, wherein the valve system comprises a valve that requires power to remain open.

5. The system according to claim 1, wherein the valve system comprises a pair of valves in series including a first valve for arming standby cooling operation and a second valve for releasing the standby coolant from the coolant storage container upon loss of power, the second valve requiring power to remain open.

6. The system according to claim 1, further comprising a compressor arranged to capture the coolant after output from the coolant storage container.

7. The system according to claim 1, wherein said volatile memory device is a Dynamic Random Access Memory (DRAM).

8. A digital data memory system, comprising:
at least one volatile memory device for storing digital data; and
a standby cooling system for the at least one volatile memory device, the standby cooling system comprising a coolant reservoir coupled to a control system, the coolant reservoir storing a standby coolant which remains in the coolant reservoir while power is supplied to the at least one volatile memory device, the control system activating the standby cooling system to release the standby coolant responsive to a loss of power to the at least one volatile memory device;
wherein, responsive to a loss of power to the at least one volatile memory device, the standby cooling system lowers the temperature of the at least one volatile memory device sufficiently to prevent loss of volatile data stored therein.

9. The digital data memory system according to claim 8, wherein the control system comprises a pair of valves in series including a first valve for arming the standby cooling system and a second valve for releasing the standby coolant from the coolant reservoir upon loss of power, the second valve requiring power to remain open.

* * * * *